United States Patent
Wu et al.

(10) Patent No.: US 7,288,885 B2
(45) Date of Patent: Oct. 30, 2007

(54) DISPLAY PANEL, ELECTRODE PANEL AND ELECTRODE SUBSTRATE THEREOF

(75) Inventors: Chao Chin Wu, Taipei County (TW); Meng-Chieh Liao, Hsinchu (TW); Jiun-Haw Lee, Taipei (TW)

(73) Assignee: Ritdisplay Corporation, Hsin Chu Industrial Park (TW)

( * ) Notice: Subject to any disclaimer, the term of this patent is extended or adjusted under 35 U.S.C. 154(b) by 80 days.

(21) Appl. No.: 10/878,112

(22) Filed: Jun. 29, 2004

(65) Prior Publication Data
US 2004/0263058 A1 Dec. 30, 2004

(30) Foreign Application Priority Data
Jun. 30, 2003 (TW) .............. 92117861 A

(51) Int. Cl.
*H01J 1/62* (2006.01)
*H01J 63/04* (2006.01)
*B32B 9/00* (2006.01)

(52) U.S. Cl. .............. 313/500; 313/505; 313/506; 313/498; 313/511; 428/690; 428/917

(58) Field of Classification Search ........ 313/495, 313/500, 505
See application file for complete search history.

(56) References Cited

U.S. PATENT DOCUMENTS

| | | | |
|---|---|---|---|
| 5,189,341 A * | 2/1993 | Itoh et al. ................ | 313/309 |
| 5,555,112 A * | 9/1996 | Oritsuki et al. ........... | 257/59 |
| 5,578,896 A * | 11/1996 | Huang ...................... | 313/309 |
| 5,578,900 A * | 11/1996 | Peng et al. ................. | 313/495 |
| 5,811,318 A * | 9/1998 | Kweon ..................... | 438/30 |
| 5,852,481 A * | 12/1998 | Hwang ..................... | 349/43 |
| 5,897,328 A * | 4/1999 | Yamauchi et al. ......... | 438/29 |
| 6,002,206 A * | 12/1999 | Harrison et al. ........... | 313/506 |
| 6,016,033 A * | 1/2000 | Jones et al. ................ | 313/506 |
| 6,313,572 B1 * | 11/2001 | Yamada ..................... | 313/310 |
| 6,366,025 B1 * | 4/2002 | Yamada ..................... | 313/498 |
| 6,822,380 B2 * | 11/2004 | Sheng et al. ............... | 313/310 |
| 2002/0190638 A1* | 12/2002 | Kahen ....................... | 313/504 |
| 2003/0117560 A1* | 6/2003 | Yang et al. ................ | 349/141 |

FOREIGN PATENT DOCUMENTS

WO WO 0060669 A1 * 10/2000

* cited by examiner

*Primary Examiner*—Sikha Roy
*Assistant Examiner*—Natalie K. Walford
(74) *Attorney, Agent, or Firm*—WPAT, P.C.; Anthony King

(57) ABSTRACT

An electrode substrate of a flat panel display comprises a substrate, an electrode layer, a conductive layer, and a barrier layer. The electrode layer is disposed above the substrate. The conductive layer is disposed above the electrode layer. The barrier layer is disposed above the conductive layer.

20 Claims, 4 Drawing Sheets $\left.\begin{array}{r}321\\322\\323\end{array}\right\}\underline{32}$

DISPLAY PANEL, ELECTRODE PANEL AND ELECTRODE SUBSTRATE THEREOF

This Non-provisional application claims priority under 35 U.S.C. §119(a) on Patent Application No(s). 092117861 filed in Taiwan on Jun. 30, 2003, the entire contents of which are hereby incorporated by reference.

BACKGROUND OF THE INVENTION

1. Field of Invention

The invention relates to a display panel, an electrode panel and an electrode substrate thereof and, in particular, to a display panel of a flat panel display, an electrode substrate of a flat panel display, and an electrode panel of a flat panel display.

2. Related Art

Referring to FIG. 1, the currently used electrode substrate 4 of a flat panel display includes a substrate 41, an electrode layer 42, and a conductive layer 43. The electrode layer 42 is disposed on the substrate 41, and the conductive layer 43 is disposed on the electrode layer 42. The material of the conductive layer 43 is selected from low resistance metals or the alloys thereof, such as a commonly used chromium or silver alloy.

In the manufacturing processes of the flat panel display, an etchant is used to etch the conductive layer 43 of the electrode substrate 4 into the required pattern of conductive lines or the pattern of auxiliary conductive lines. Then, a light-emitting area is formed on the electrode substrate 4 and a corresponding electrode is formed on the light-emitting area. Finally, the electrode substrate 4 is connected with a driving device (e.g., driving chip) to form the display panel.

During the process of forming the pattern of conductive lines or the pattern of auxiliary conductive lines on the electrode substrate 4, a photoresist layer 5 is provided on the conductive layer (e.g. silver alloy) 43, and a patterned mask 6 is then disposed above the photoresist layer 5. Meanwhile, an ultra-violet light (UV light) illuminates the patterned mask 6 and the photoresist layer 5, as shown in FIG. 2A. Thereafter, a development step is performed. Finally, the etchant is used to etch the conductive layer 43 into required pattern of the conductive lines 431, as shown in FIG. 2B. However, the conductive layer (e.g. silver alloy) 43 tends to be oxidized and becomes black owing to the exposure of the UV light, thereby increasing the resistance of the conductive layer 43 and reducing the adhesion force between the conductive layer 43 and the photoresist layer 5. Meanwhile, in the subsequent processes, the driving device (driving chip) is pressed and adhered onto the conductive lines 431, the oxidized conductive lines 431 cannot be easily adhered to the driving device. The driving device tends to be peeled or separated from the conductive lines 431, thereby influencing the reliability of the display panel. In addition, when the display panel is used, the conductive lines 431 also tend to react with the external oxygen or sulfur. Thus, the conductive lines 431 tend to be oxidized or even burnt out owing to the heat generated when the current flows therethrough.

This invention is therefore to provide a display panel, an electrode panel and an electrode substrate thereof, which can solve the above-mentioned problems.

SUMMARY OF THE INVENTION

In view of the above-mentioned problems, this invention is to provide a display panel having a barrier layer, an electrode substrate and electrode panel for the display panel. The barrier layer can protect the conductive layer (conductive lines) from being oxidized and burnt out, and also control the etched shapes of the conductive lines.

In this invention, the display panel, electrode substrate and electrode panel thereof are applied to a flat panel display.

This invention provides an electrode substrate of a flat panel display. The electrode substrate at least comprises a substrate, an electrode layer, a conductive layer and a barrier layer. The electrode layer is disposed above the substrate, the conductive layer is disposed above the electrode layer, and the barrier layer is disposed above the conductive layer.

This invention also provides an electrode panel of a flat panel display. The electrode panel at least comprises a substrate, an electrode layer pattern, a conductive line pattern, and a barrier layer pattern. The electrode layer pattern is disposed above the substrate, the conductive line pattern is disposed above the electrode layer pattern, and the barrier layer pattern is disposed above the conductive line pattern.

This invention further provides a display panel of a flat panel display. The display panel at least comprises a substrate, a light-emitting region, a driving device, a conductive line pattern and a barrier layer. The light-emitting region has a plurality of pixels, each of which having a first electrode, a second electrode and a light-emitting layer. The first electrode is disposed above the substrate, the second electrode is disposed over the first electrode, and the light-emitting layer is sandwiched between the first electrode and the second electrode. The driving device drives the pixels. The conductive line pattern is disposed above the substrate and has a plurality of conductive lines for connecting the first electrodes to the driving device and the second electrodes to the driving device respectively. The barrier layer is disposed above the conductive line pattern.

In this invention, the flat panel display includes but not limited to an organic electroluminescent (OEL) display, an electroluminescent (EL) display, a light-emitting diode (LED) display, a liquid crystal display (LCD), a plasma display panel (PDP), a vacuum fluorescent display (VFD), a field emission display (FED), and an electro-chromic display.

As mentioned above, the display panel of this invention and its electrode substrate and electrode panel has a barrier layer for protecting the conductive layer (conductive lines). Compared to the prior art, the barrier layer of this invention may prevent the conductive layer from being oxidized owing to the exposure of the UV light, and thus prevent increasing the resistance of the conductive layer and enhance the adhesion between the conductive layer and the photoresist layer. Meanwhile, when the display panel is used, the barrier layer also may enhance the interface adhesion strength, prevent the conductive lines from the influence of the external oxygen or sulfur, and thus prevent the conductive lines from being oxidized or even burnt out. In particular, the conductive lines may be well adhered to the driving device without being easily separated, which may further ensure the stability of the display panel. Furthermore, this invention may control the shape of the patterned conductive line. When the angle between the side surface of the conductive line and the electrode layer is larger than 90 degrees, the adhesion area between the bottom of the conductive line and the electrode layer is larger than that of the prior art. That is, if the area of the electrode substrate is fixed, the adhesion area between the conductive line and the electrode layer of the invention is larger than that of the prior art. Hence, the adhesion between the conductive line and the electrode layer is more reinforced and the conductive line and the electrode layer cannot be easily peeled or separated. In addition, when the angle between the side surface of the conductive line and the electrode layer is smaller than 90 degrees, the adhesion area between the conductive line (and barrier layer) and the driving device is larger than that of the prior art, and the conductive line and the driving device cannot be easily separated. Also, it may avoid the electron migration and short-circuited possibilities that occur at the bottom of the conductive line, and thereby ensuring the reliability of the display panel. Furthermore, this invention may be implemented using one etchant. Therefore, only one etching step is required to simultaneously etch the barrier layer and the electrode layer. Also, this invention is quite suitable in the practical industry because this invention has simple manufacturing processes and the overall cost is not significantly increased.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The electrode substrate to be described in the following is an electrode substrate of a flat panel display.

Figure 1:
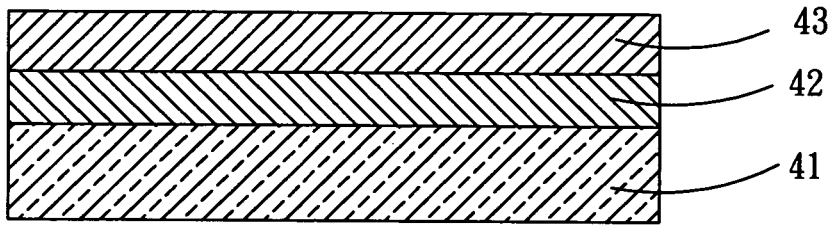
FIG. 1 is a schematic illustration showing an electrode substrate of a conventional flat panel display.
Figure 2A:
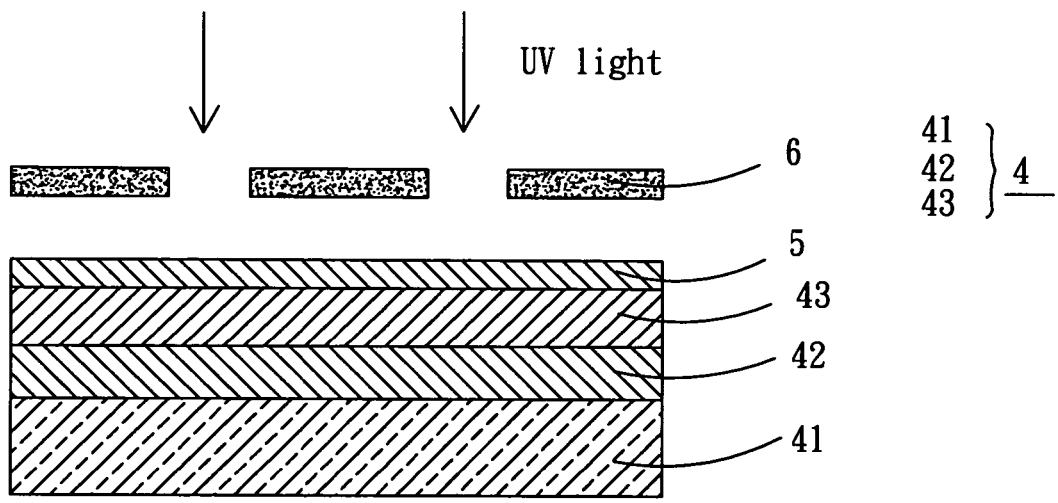
FIGS. 2A and 2B are a disposed of cross-sectional views showing that the patterns of conductive lines or auxiliary conductive lines are formed on the electrode substrate of the conventional flat panel display.
Figure 2B:
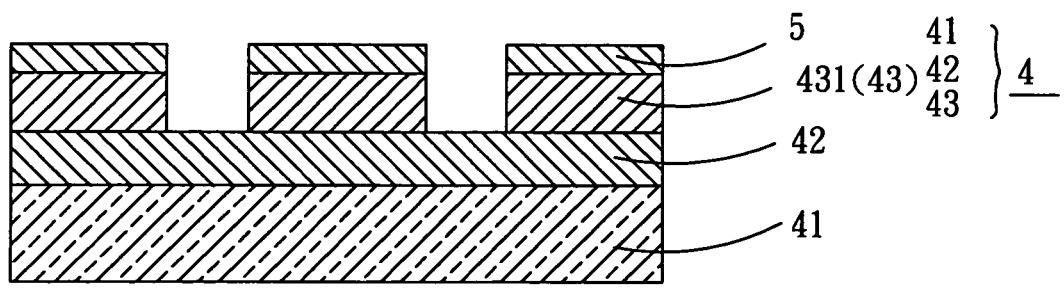
Figure 3:
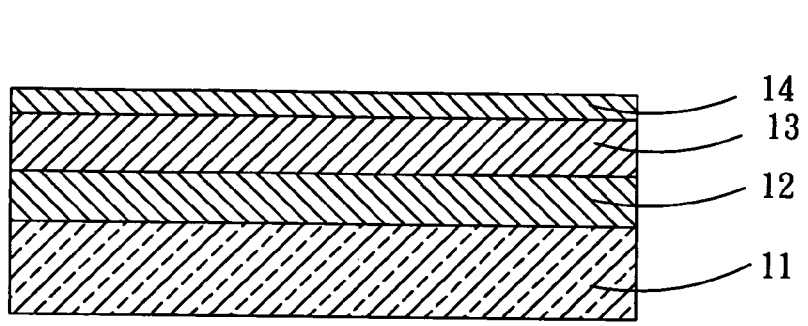
FIG. 3 is a schematic illustration showing an electrode substrate of a flat panel display according to a first embodiment of the invention.

Referring to FIG. 3, an electrode substrate 1 of a flat panel display according to a first embodiment of the invention includes a substrate 11, an electrode layer 12, a conductive layer 13, and a barrier layer 14. The electrode layer 12 is disposed on the substrate 11, the conductive layer 13 is disposed on the electrode layer 12, and the barrier layer 14 is disposed on the conductive layer 13.

In the present embodiment, the substrate 11 can be a flexible substrate or a rigid substrate. The substrate 11 can also be a plastic substrate or a glass substrate. In particular, the flexible substrate or plastic substrate can be made of polycarbonate (PC), polyester (PET), cyclic olefin copolymer (COC), or metallocene-based cyclic olefin copolymer (mCOC).

Referring to FIG. 3, the electrode layer 12 is disposed on the substrate 11. In this embodiment, the electrode layer 12 is formed on the substrate 11 by way of a sputtering method or an ion plating method. The electrode layer 12 is usually used as an anode and made of a transparent conductive metal oxide, such as indium-tin oxide (ITO), aluminum-zinc oxide (AZO), or indium-zinc oxide (IZO).

The conductive layer 13 of this embodiment of FIG. 3 is disposed on the electrode layer 12, wherein the material of the conductive layer 13 may be aluminum, silver, copper, aluminum-containing alloy, silver-containing alloy or copper-containing alloy. Because these metals or alloys have the low resistance, the high electrical conductivity and the higher mechanical intensity, they are very suitable for the wires. Herein, the thickness of the conductive layer 13 is about 100 Å to 10000 Å.

The barrier layer 14 of this embodiment of FIG. 3 is disposed on the conductive layer 13. Herein, the barrier layer 14 protects the conductive layer 13 from the oxidation when the UV light is illuminated on the conductive layer 13. Herein, the material of the barrier layer 14 may be platinum, gold, titanium, molybdenum, chromium, platinum-containing alloy, gold-containing alloy, titanium-containing alloy, molybdenum-containing alloy or chromium-containing alloy.

In addition, the barrier layer 14 also may enhance the adhesion strength with the driving device. For example, when the material of the barrier layer 14 is titanium or titanium alloy, the adhesion between the barrier layer 14 and the driving device is better than that between the conductive layer 13 and the driving device because the titanium or titanium alloy is active metal. That is, when the barrier layer 14 is adhered to the driving device, the adhesion portion will be formed with a compound, which may enhance the adhesion between the barrier layer 14 and the driving device. In addition, a thin, compact, and fine oxidation layer (titanium oxide) may be formed on the surface of the titanium, and the compact and fine oxidation layer is formed as a passivation material with good etching-resistivity. Herein, the thickness of the barrier layer 14 is about 10 521 to 1000 Å.

In this embodiment, the thickness of the conductive layer 13 and the barrier layer 14 may be adjusted according to the actual condition.

In the processes of forming the conductive line pattern or auxiliary conductive line pattern on the electrode substrate 1, a photoresist layer is firstly formed on the barrier layer 14, a patterned mask is disposed above the photoresist layer, and then the UV light is illuminated on the patterned mask and the photoresist layer. Thereafter, the photoresist layer is patterned by the development step. Finally, the etchant is used for etching.

Figure 4:
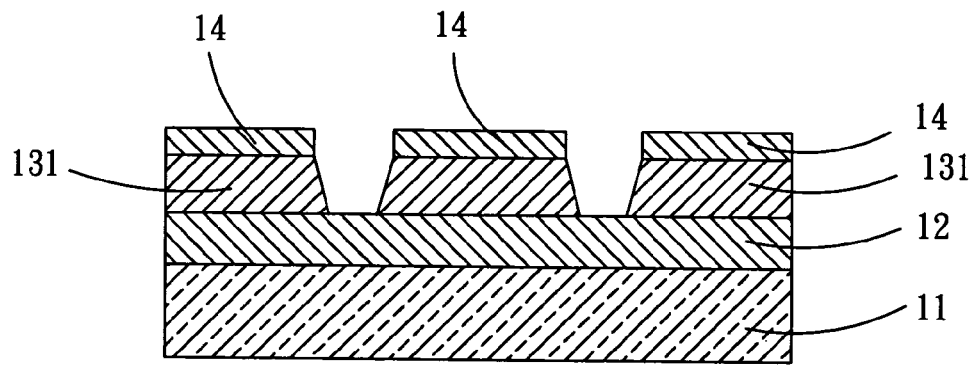
FIG. 4 is a cross-sectional view showing that a pattern of conductive lines or auxiliary conductive lines is formed on the electrode substrate of the flat panel display in the first embodiment.

As shown in FIG. 4, properly controlling the factors, such as the thickness and material of the barrier layer 14 and the etching parameters in this embodiment can control the shapes of the conductive lines 131 which the conductive layer 13 is etched. For example, the angle between the conductive line 131 and the electrode layer 12 is greater than 90 degrees. When the angle between the side surface of the conductive line 131 and the electrode layer 12 is greater than 90 degrees, the adhesion area between the bottom of the conductive line 131 and the electrode layer 12 is larger than that in the prior art. That is, if the area of the electrode substrate is fixed, the adhesion area between the conductive line 131 and the electrode layer 12 of the invention is larger than that of the prior art. Hence, the adhesion strength therebetween is reinforced and the conductive line 131 and the electrode layer 12 cannot be easily peeled or separated.

Figure 5:
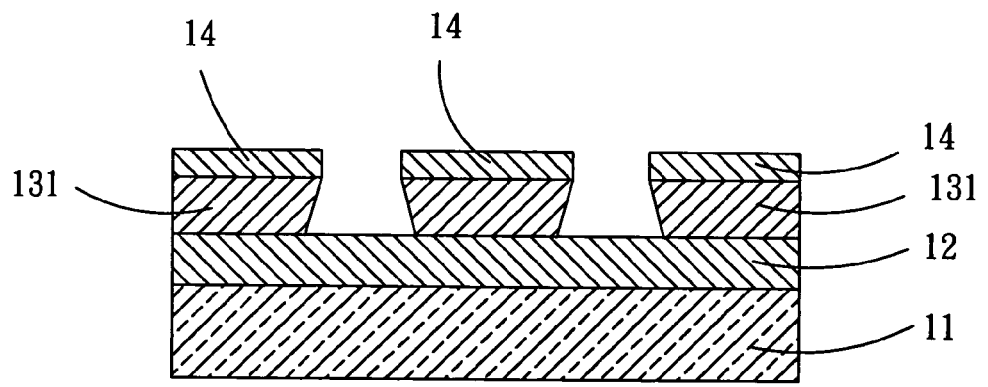
FIG. 5 is another cross-sectional view showing that another pattern of conductive lines or auxiliary conductive lines is formed on the electrode substrate of the flat panel display in the first embodiment.

Of course, the angle between the conductive line 131 and the electrode layer 12 also may be smaller than 90 degrees, as shown in FIG. 5. When the angle between the side surface of the conductive line 131 and the electrode layer 12 is smaller than 90 degrees, the adhesion area between the conductive line 131 (barrier layer 14) and the driving device (not shown) is larger than that of the prior art, and the conductive line 131 and the driving device cannot be easily separated. Also, it may avoid the electron migration and short-circuited conditions that occur at the bottom of the conductive line 131, and thereby ensuring the reliability of the electrode substrate 1.

In addition, only one etchant may be used to etch the conductive layer 13 and the barrier layer 14 in the etching step. That is, the barrier layer 14 and the conductive layer 13 may be etched simultaneously by only one etching process.

Of course, other desired patterns also may be formed on the electrode substrate 1 in the same way.

The electrode panel to be described in the following is an electrode panel of a flat panel display.

Figure 6:
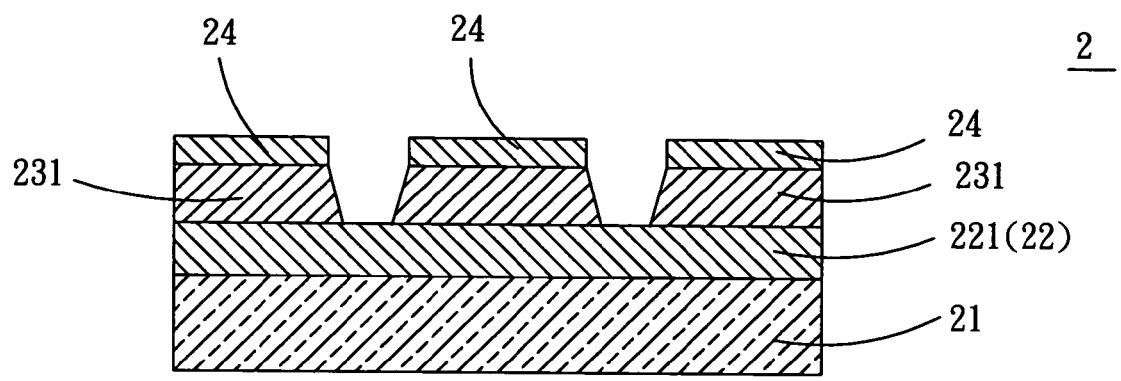
FIG. 6 is a schematic illustration showing an electrode substrate of a flat panel display according to a second embodiment of the invention.

Referring to FIG. 6, an electrode panel 2 of a flat panel display according to a second embodiment of the invention includes a substrate 21, an electrode layer pattern 22, a conductive line pattern 23 and a barrier layer pattern 24. In this embodiment, the electrode layer pattern 22 is disposed on the substrate 21 and has at least one electrode line 221. The conductive line pattern 23 is disposed on the electrode layer pattern 22 and has at least one conductive line 231. The barrier layer pattern 24 is disposed on the conductive line pattern 23.

The features and functions of the substrate 21, the electrode layer pattern 22 and the barrier layer pattern 24 in this embodiment are the same as those of the substrate 11, the electrode layer 12 and the barrier layer 14 in the first embodiment, and detailed descriptions thereof will be omitted.

Figure 7:
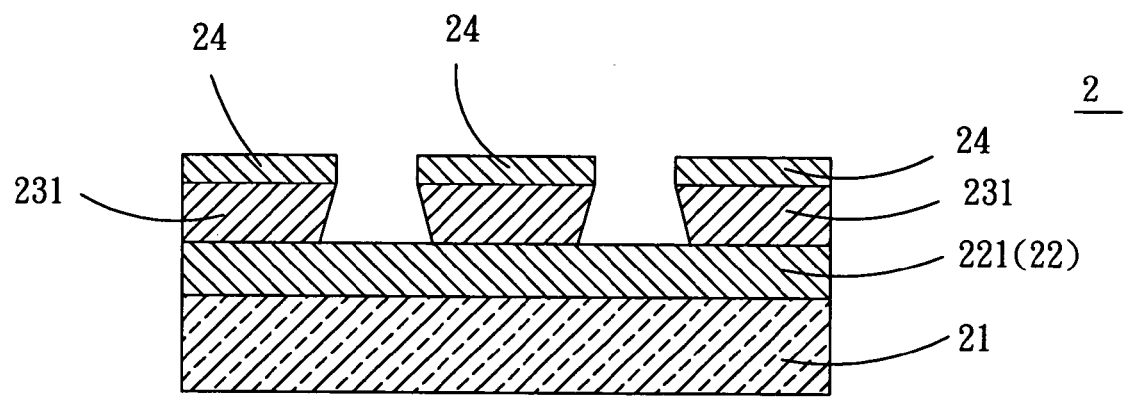
FIG. 7 is another schematic illustration showing another electrode substrate of the flat panel display according to the second embodiment of the invention.

In this embodiment, the cross-section of the conductive line 231 is a trapezoid, as shown in FIG. 6. In addition, the cross-section of the conductive line 231 may be an inverted trapezoid, as shown in FIG. 7.

The features and functions of the conductive line pattern 23 in this embodiment are the same as those of the conductive layer 13 in the first embodiment, and detailed descriptions thereof will be omitted.

The display panel to be described in the following is a display panel of a flat panel display.

Figure 8A:
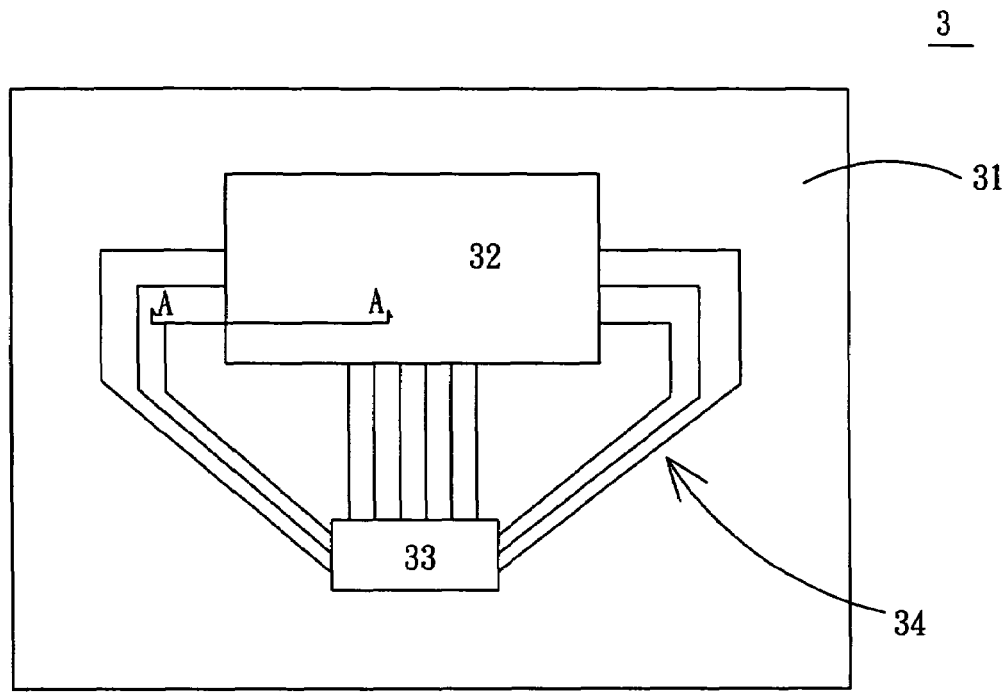
FIG. 8A is a schematic illustration showing a display panel of a flat panel display according to a third embodiment of the invention.
Figure 8B:
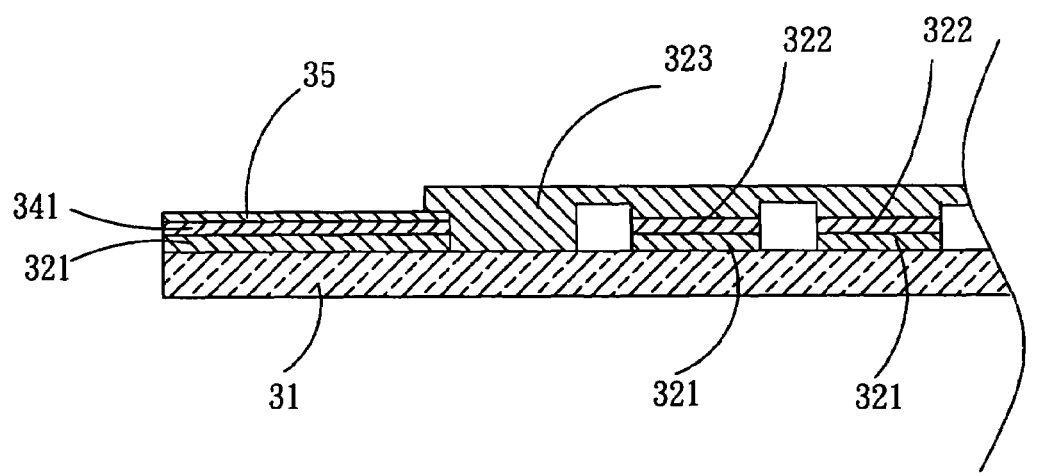
FIG. 8B is a cross-sectional view taken along a dashed line A-A of FIG. 8A.

Referring to FIGS. 8A and 8B, a display panel 3 of a flat panel display according to a third embodiment of the invention includes a substrate 31, a light-emitting area 32, a driving device 33, a conductive line pattern 34, and a barrier layer 35. The light-emitting area 32 has a plurality of pixels, and each of the pixels has a first electrode 321, a second electrode 323 and a light-emitting layer 322. The first electrode 321 is disposed on the substrate 31. The second electrode 323 is disposed over the first electrode 321. The light-emitting layer 322 is disposed between the first electrode 321 and the second electrode 323. The driving device 33 drives the pixels. The conductive line pattern 34 is disposed over the substrate 31 and has a plurality of conductive lines 341 for connecting the first electrodes 321 to the driving device 33 and the second electrodes 323 to the driving device 33, respectively. The barrier layer 35 is disposed on the conductive line pattern 34.

The following is the description of a display panel of an OEL display.

With reference to FIG. 8, each of the pixels has a first electrode 321, a second electrode 323 and a light-emitting layer 322. The first electrode 321 is disposed on the substrate 31. The second electrode 323 is disposed over the first electrode 321. The light-emitting layer 322 is disposed between the first electrode 321 and the second electrode 323.

The features and functions of the first electrodes 321 in this embodiment are the same as those of the electrode layer 12 in the first embodiment, and detailed descriptions thereof will be omitted.

In addition, the light-emitting layer 322 is an organic functional layer. The organic functional layer usually contains a hole-injecting layer, a hole-transporting layer, a light-emitting layer, an electron-transporting layer, and an electron-injecting layer (not shown). The hole-injecting layer is mainly comporisedcopper phthalocyanine (CuPc), the hole-transporting layer is mainly comporised4,4'-bis[N-(1-naphthyl)-N-phenylamino]biphenyl (NPB), the electron-injecting layer is mainly comporised lithium fluoride (LiF), and the electron-transporting layer is mainly comporised tris(8-quinolinato-N1,08)-aluminum (Alq). The organic functional layer can be formed by utilizing evaporation, spin coating, ink jet printing, or printing. In addition, the light emitted from the organic functional layer can be blue, green, red, white or other monochromatic light, or a color light as a combination of monochromatic lights. Wherein, the white light may be generated by mixing the orange light, which are generated by the orange material, with the complementary blue light, which are generated by the light-emitting material of complementary blue. Of course, other complementary light-emitting materials also may be utilized to generate the white light rays.

Furthermore, the second electrode 323 is disposed on the light-emitting layer 322. In this case, the second electrode 323 is formed on the light-emitting layer 322 by way of evaporation or sputtering. The material of the second electrode 323 can be aluminum, calcium, magnesium, indium, tin, manganese, silver, gold, magnesium-containing alloy such as magnesium-silver alloy, magnesium-indium alloy, magnesium-tin alloy, magnesium-antimony alloy and magnesium-tellurium alloy.

Referring to FIG. 8A again, the driving device 33 of this embodiment is for driving the pixels. Herein, the driving device 33 includes a driving chip.

Referring to FIGS. 8A and 8B again, the conductive line pattern 34 of this embodiment is disposed over the substrate 31. The conductive line pattern 34 has a plurality of conductive lines 341 for connecting the first electrodes 321 to the driving device 33 and the second electrodes 323 to the driving device 33, respectively. The features and functions of the conductive lines 341 in this embodiment are the same as those of the conductive line 131 in the first embodiment, and detailed descriptions thereof will be omitted.

Next, the barrier layer 35 is disposed on the conductive line pattern 34. When the display panel 3 of this embodiment is used, the barrier layer 35 may prevent the conductive lines 341 from being influenced by the external oxygen or sulfur and thus being oxidized or even burnt out. In addition, the conductive lines 341 may be adhered to the driving device 33 and cannot be easily separated from the driving device 33, thereby ensuring the stability of the display panel 3. The features and functions of the barrier layer 35 and the substrate 31 in this embodiment are the same as those in the first embodiment, and detailed descriptions thereof will be omitted.

In the invention, the flat panel display comprises and is not meant to be limited to an organic electroluminescence (OEL) display, an electroluminescence (EL) display, a light-emitting diode (LED) display, a liquid crystal display (LCD), a plasma display panel (PDP), a vacuum fluorescent display (VFD), a field emission display (FED), and an electro-chromic display.

The display panel of this invention and its electrode substrate and electrode panel has a barrier layer for protecting the conductive layer (conductive lines). Compared to the prior art, the barrier layer of the invention may prevent the conductive layer from being oxidized owing to the exposure of the UV light, and thus prevent the resistance value of the conductive layer from increasing and enhance the adhesion strength between the conductive layer and the photoresist layer. Meanwhile, when the display panel is used, the barrier layer also may prevent the conductive lines from the influence of the external oxygen or sulfur and thus prevent the conductive lines from being oxidized or even burnt out. In addition, the conductive lines may be well adhered to the driving device without being easily separated, which may further ensure the stability of the display panel. Furthermore, the invention may further control the shape of the etched conductive line. When the angle between the side surface of the conductive line and the electrode layer is larger than 90 degrees, the adhesion area between the bottom of the conductive line and the electrode layer is larger than that of the prior art. That is, if the area of the electrode substrate is fixed, the adhesion area between the conductive line and the electrode layer of the invention is larger than that of the prior art. Hence, the adhesion between the conductive line and the electrode layer is more compact and the conductive line and the electrode layer cannot be easily separated. In addition, when the angle between the side surface of the conductive line and the electrode layer is smaller than 90 degrees, the adhesion area between the conductive line (and barrier layer) and the driving device is larger than that of the prior art, and the conductive line and the driving device cannot be easily separated. Also, it may avoid the electron migration and short-circuited conditions that occur at the bottom of the conductive line, and thereby ensuring the reliability of the display panel. Furthermore, the invention may be implemented using one etchant, so only one etching step is required to simultaneously etch the barrier layer and the electrode layer. Also, because the invention has simple manufacturing processes and the overall cost is not greatly increased, this invention is quite suitable in the practical industry.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electrode substrate of a flat panel display, comprising:
   a substrate;
   an first electrode layer disposed directly on the substrate, wherein the first electrode layer is partitioned into a first region and a second region;
   a second electrode layer disposed above the first electrode layer in the second region;
   a conductive layer disposed directly on the first electrode layer in the first region, wherein the conductive layer is electrically connected to first electrode layer; and
   an electrically conductive barrier layer disposed exclusively and directly on the conductive layer, wherein the conductive layer is interposed between the first region of the first electrode layer and the electrically conductive barrier layer.

2. The electrode substrate according to claim 1, wherein the material of the conductive layer is at least one selected from the group consisting of aluminum, silver, copper, aluminum-containing alloy, silver-containing alloy and copper-containing alloy.

3. The electrode substrate according to claim 1, wherein the material of the barrier layer is at least one selected from the group consisting of platinum, gold, titanium, molybdenum, chromium, platinum-containing alloy, gold-containing alloy, titanium-containing alloy, molybdenum-containing alloy, and chromium-containing alloy.

4. The electrode substrate according to claim 1, wherein the substrate is a flexible substrate or a rigid substrate.

5. The electrode substrate according to claim 1, wherein the substrate is a plastic substrate or a glass substrate.

6. The electrode substrate according to claim 1, wherein the thickness of the conductive layer is substantial from 100 .ANG. to 10000 .ANG.

7. The electrode substrate according to claim 1, wherein the thickness of the barrier layer is substantial from 10 .ANG. to 1000 .ANG.

8. An electrode panel of a flat panel display, comprising:
   a substrate;
   a first electrode layer pattern disposed directly on the substrate, the first electrode layer pattern having at least one electrode line in a first part of the first electrode layer pattern;
   a second electrode layer pattern disposed above a second part of the first electrode layer pattern;
   a conductive line pattern disposed directly on the first part of the first electrode layer pattern, the conductive line pattern having at least one conductive line, wherein the conductive line pattern is electrically connected to first electrode layer pattern; and
   an electrically conductive barrier layer pattern disposed exclusively and directly on the conductive line pattern, wherein the conductive line pattern is interposed between the first part of the first electrode layer pattern and the electrically conductive barrier layer.

9. The electrode panel according to claim 8, wherein the material of the conductive line is at least one selected from the group consisting of aluminum, silver, copper, aluminum-containing alloy, silver-containing alloy, and copper-containing alloy.

10. The electrode panel according to claim 8, wherein a cross section of the conductive line is an inverted trapezoid.

11. The electrode panel according to claim 8, wherein a cross section of the conductive line is a trapezoid.

12. The electrode panel according to claim 8, wherein the conductive line pattern has a plurality of conductive lines, and the conductive lines are parallel to each other.

13. The electrode panel according to claim 8, wherein the second electrode layer pattern has a plurality of electrode lines, and the electrode lines are parallel to each other.

14. The electrode panel according to claim 8, wherein the material of the barrier layer pattern is at least one selected from the group consisting of platinum, gold, titanium, molybdenum, chromium, platinum-containing alloy, gold-containing alloy, titanium-containing alloy, molybdenum-containing alloy, and chromium-containing alloy.

15. The electrode panel according to claim 8, wherein the thickness of the conductive line pattern is substantial from 100 .ANG. to 10000 .ANG.

16. The electrode panel according to claim 8, wherein the thickness of the barrier layer pattern is substantial from 10 .ANG. to 1000 .ANG.

17. A display panel of a flat panel display, comprising:
a substrate;
a light-emitting area having a plurality of pixels, each of the pixels having a first electrode, a second electrode, and a light-emitting layer, wherein the first electrode is disposed directly on the substrate, the second electrode is disposed only above a first part of the first electrode, and the light-emitting layer is disposed between the first electrode and the second electrode;
a driving device driving the pixels;
a conductive line pattern disposed above the substrate, wherein the conductive line pattern has a plurality of conductive lines, and the conductive lines, disposed directly on a second part of the first electrode, connect the first electrodes to the driving device and connect the second electrodes to the driving device respectively; and
an electrically conductive barrier layer disposed exclusively and substantially on the entire conductive line pattern, wherein the conductive lines of the conductive line pattern are interposed between the second part of the first electrode and the electrically conductive barrier layer.

18. The display panel according to claim 17, wherein the material of the conductive lines is at least one selected from the group consisting of aluminum, silver, copper, aluminum-containing alloy, silver-containing alloy, and copper-containing alloy.

19. The display panel according to claim 17, wherein the material of the barrier layer is at least one selected from the group consisting of platinum, gold, titanium, molybdenum, chromium, platinum-containing alloy, gold-containing alloy, titanium-containing alloy, molybdenum-containing alloy, and chromium-containing alloy.

20. The display panel according to claim 17, wherein the driving device comprises a driving chip.

* * * * *